United States Patent
Shaue et al.

(10) Patent No.: US 9,182,443 B2
(45) Date of Patent: Nov. 10, 2015

(54) TESTING DEVICE AND TESTING METHOD THEREOF

(71) Applicant: Princo Middle East FZE, Dubai (AE)

(72) Inventors: Gan-how Shaue, Hsinchu (TW); Chih-kuang Yang, Hsinchu (TW)

(73) Assignee: PRINCO MIDDLE EAST FZE, Dubai (AE)

( * ) Notice: Subject to any disclaimer, the term of this patent is extended or adjusted under 35 U.S.C. 154(b) by 129 days.

(21) Appl. No.: 14/079,349

(22) Filed: Nov. 13, 2013

(65) Prior Publication Data

US 2014/0167803 A1 Jun. 19, 2014

(30) Foreign Application Priority Data

Dec. 17, 2012 (TW) .............................. 101147926 A

(51) Int. Cl.
*G01R 31/00* (2006.01)
*G01R 31/26* (2014.01)
*G01R 1/073* (2006.01)

(52) U.S. Cl.
CPC .......... *G01R 31/2601* (2013.01); *G01R 1/0735* (2013.01)

(58) Field of Classification Search
CPC .............. H01L 23/49816; H01L 23/49822; H01L 23/4985; H01L 2224/16227; H01L 2224/12105; H01L 2224/13191; H01L 2224/94; H01L 2225/06513; H01L 2225/06517; H01L 2225/1058; H01L 21/4857; H01L 22/14; H01L 24/94; H01L 24/13; G01R 1/07314; G01R 1/0491; G01R 1/06716; G01R 1/06755; H05K 3/4007

USPC ............ 324/756.01, 756.02, 756.04, 756.05, 324/756.07, 757.03, 757.04, 757.05, 324/762.01, 762.02, 762.05, 762.06; 257/737, 738, 752, 779, 780, 784, 688
See application file for complete search history.

(56) References Cited

U.S. PATENT DOCUMENTS 4,932,883 A * 6/1990 Hsia .................... G01R 1/07307
439/66
5,729,896 A * 3/1998 Dalal ................ H01L 23/49816
174/260

(Continued)

FOREIGN PATENT DOCUMENTS

EP 1795905 A1 6/2007
JP 07-113840 A 5/1995

(Continued)

OTHER PUBLICATIONS

Bakir et al. SOL-Compliant: Wafer Level Package Technolgoies, Apr. 2002, www.semiconductor.net, pp. 63-66.*

*Primary Examiner* — Patrick Assouad
*Assistant Examiner* — Sean Curtis
(74) *Attorney, Agent, or Firm* — Hauptman Ham, LLP

(57) ABSTRACT

Disclosed are a testing device and a testing method thereof. The testing device includes a frame, a flexible multi-layer substrate and at least one electrical testing point. The frame is positioned corresponding to a chip. At least one electrical connecting point is formed on a surface of the chip. The flexible multi-layer substrate is fixed in the frame. The electrical testing point is corresponding to the electrical connecting point and formed on an upper surface of the flexible multi-layer substrate for contacting the electrical connecting point and performing an electrical test to the chip. Furthermore, the electrical connecting point or the electrical testing point is a bump.

28 Claims, 5 Drawing Sheets

(56) References Cited

U.S. PATENT DOCUMENTS

| | | | | |
|---|---|---|---|---|
| 5,929,521 | A * | 7/1999 | Wark | G01R 1/06738 257/692 |
| 5,977,783 | A * | 11/1999 | Takayama | G01R 1/06761 324/755.01 |
| 6,466,046 | B1 * | 10/2002 | Maruyama | G01R 31/2886 324/754.15 |
| 6,563,330 | B1 * | 5/2003 | Maruyama | G01R 31/2886 342/754.14 |
| 7,235,412 | B1 * | 6/2007 | Mardi | H01L 22/32 438/14 |
| 7,524,697 | B2 * | 4/2009 | Makihira | G01R 1/0483 257/E21.006 |
| 7,776,626 | B2 * | 8/2010 | Hasebe | G01R 31/2889 257/48 |
| 8,305,101 | B2 * | 11/2012 | Desta | G01R 1/07378 324/754.03 |
| 8,357,933 | B2 * | 1/2013 | Hasebe | G01R 31/2889 257/48 |
| 8,430,676 | B2 * | 4/2013 | Dang | G01R 31/2889 439/66 |
| 8,501,502 | B2 * | 8/2013 | Guu | H01L 22/20 257/E21.524 |
| 8,658,437 | B2 * | 2/2014 | Guu | H01L 22/14 257/E21.524 |
| 8,797,057 | B2 * | 8/2014 | Wu | G01R 31/2884 324/754.1 |
| 8,917,106 | B2 * | 12/2014 | Namburi | G01R 3/00 324/755.07 |
| 8,956,915 | B2 * | 2/2015 | Yamazaki | H01L 23/4985 257/675 |
| 2001/0040464 | A1 * | 11/2001 | Tanioka | G01R 1/07314 324/755.09 |
| 2007/0075726 | A1 * | 4/2007 | Chan | G01R 1/06711 324/754.18 |
| 2011/0032063 | A1 | 2/2011 | Dang et al. | |
| 2013/0341784 | A1 * | 12/2013 | Lin | H01L 21/56 257/737 |
| 2015/0008576 | A1 * | 1/2015 | Khandekar | H01L 24/11 257/737 |

FOREIGN PATENT DOCUMENTS

| | | | | |
|---|---|---|---|---|
| JP | 08-005666 | A | | 1/1996 |
| JP | 9-237811 | A | | 9/1997 |
| JP | 11-160356 | A | | 6/1999 |
| JP | 11-258268 | A | | 9/1999 |
| JP | 2000-180506 | A | | 6/2000 |
| JP | 2001-351945 | A | | 12/2001 |
| JP | 2003-232831 | A | | 8/2003 |
| JP | 2003232831 | A * | 8/2003 | ............ G01R 31/26 |
| JP | 2007-178196 | | | 7/2007 |
| JP | 2010-256371 | A | | 11/2010 |
| TW | 200612801 | | | 4/2006 |
| TW | M309109 | | | 4/2007 |
| TW | 201124728 | | | 7/2011 |

* cited by examiner

TESTING DEVICE AND TESTING METHOD THEREOF

CROSS-REFERENCE TO RELATED APPLICATION

This application claims priority from and the benefit under 35 U.S.C. §119(a) of Taiwanese Patent Application No. 101147926, filed on Dec. 17, 2012 in the TIPO (Taiwan Intellectual Property Office), which is hereby incorporated by reference for all purposes as if fully set forth herein.

BACKGROUND OF THE INVENTION

1. Field of the Invention

The present invention generally relates to a testing substrate and a testing method thereof, and more particularly to a testing substrate for fine pitch wafer level tests and a testing method thereof.

2. Description of Prior Art

With rapid development of integration of integrated circuit (IC) technologies, relevant package technologies have reached an unprecedented and innovative level than ever. In numerous innovative package technologies, a wafer level package (WLP) or a chip scale package (CSP) is a type of IC chip package and is also the most representative skill which is considered as a revolutionary skill. After the wafer level packages, the sizes of IC chips are almost the same as original sizes of dies. Therefore, it is also well known as a wafer level chip scale package (WLCSP) in industry. Regardless of the WLP which is packaged on the wafer or packages of other forms, numbers of solder balls and bumps of one IC chip to be tested is increasing and sizes are small. Distances among the soldering balls and the bumps are decreased (fine pitch) for meeting design trends of miniaturization of electronic products. Current probing technologies utilized in the wafer level comprise cantilever probe cards and vertical probe cards. In order to match with the increasing numbers of the solder balls and the bumps, the small sizes and the fine pitch requirements, a number of probes is required to be increased and probe spacing between the probes should be decreased. Material of the probes comprises tungsten (W), beryllium copper (BeCu), palladium alloy and so on. Regardless of the probe cards are the cantilever probe cards or the vertical probe cards, the probing technologies faces difficulties and disadvantages due to the small sizes of the soldering balls and the bumps.

Firstly, in the probing technologies, the probes have to destroy oxidation layers on the soldering balls and the bumps for forming probe marks on surfaces of pads, thereby achieving a requirement of contact resistance in electrical tests. However, it is difficult not to destroy structures of the soldering balls and the bumps. The probe marks must occur for ensuing that the probes of one probe card contact the pads. Furthermore, it can be understood by observing the probe marks that when the probe marks are small, the electrical tests fail due to poor contact. When the probe marks are large, the surfaces of the pads are destroyed and gaps are formed in bonding surfaces, such that poor bonding occurs in the following bonding processes. Even more seriously, oxidation is formed after the surfaces of the pads are destroyed, and thus the bonding surfaces are oxidized and bonding strength is decreased.

Accordingly, although the material and the structure of the probes are improved in the current industry, this is a basic and main subject in the semiconductor testing industry. When the soldering balls and the bumps are getting smaller and smaller, a rate of destroying portion is increased. In order to ensure a yield rate after the electrical tests, additional optical inspection machines and processes are required for examining the tested products. As a result, burden and cost are increased.

Furthermore, the soldering balls and the bumps are not similar to the pads which are flat. After miniaturization, the structures do not have enough flat surfaces. It is impossible to test the soldering balls and the bumps by the probes. Accordingly, it is necessary to develop a testing device and a testing method thereof for a wafer level and fine-pitch test.

SUMMARY OF THE INVENTION

An objective of the present invention is to provide a testing device and a method thereof, which is suitable for high density and fine pitch wafer level tests without utilizing the conventional probe technology for performing an electrical test to electrical connecting points (soldering balls and bumps). In the present invention, electrical testing points and electrical connecting points are not damaged. Appearances, shapes and structures of the electrical connecting points (soldering balls and bumps) and electrical testing points can maintain completeness, and a requirement for a contact resistance in the electrical test can be met.

The testing device of the present invention comprises:
a frame positioned corresponding to a chip, and at least one electrical connecting point formed on a surface of the chip;
a flexible multi-layer substrate fixed in the frame; and
at least one electrical testing point corresponding to the at least one electrical connecting point, formed on an upper surface of the flexible multi-layer substrate for contacting the at least one electrical connecting point for performing an electrical test to the chip.

According to the present invention, when the electrical test is performed to the chip, a contact area between the at least one electrical connecting point and the at least one electrical testing point is larger than 1 $\mu m^2$. Furthermore, a surface structure of the contact area maintains completeness, and thus probe marks are not produced easily. Structures of the at least one electrical connecting point and the least one electrical testing point maintain completeness after the electrical test is performed. Furthermore, a height of the at least one electrical connecting point or at least one electrical testing point is less than 100 μm in the present invention.

According to the present invention, a contact resistance as the at least one electrical connecting point contacts the at least one electrical testing point may be less than 5 ohm. A preferred value of the contact resistance is less than 1 ohm. The at least one electrical connecting point is a bump. An inert metal or a precious metal may be formed on or cover a surface of the at least one electrical connecting point and a surface of the at least one electrical testing point.

The testing device of the present invention further comprises an elastic supporting body disposed between the frame and the flexible multi-layer substrate. When the at least one electrical connecting point contacts the at least one electrical testing point and applies a force to the at least one electrical testing point, the elastic supporting body is utilized for providing a supporting force to the flexible multi-layer substrate. Alternatively, the testing device of the present invention further comprises at least one supporting protruding point formed on a lower surface of the flexible multi-layer substrate and corresponding to the at least one electrical testing point for providing a supporting force to the flexible multi-layer substrate.

Furthermore, the flexible multi-layer substrate may be fixed in the frame by soldering edges of the flexible multi-layer substrate. Alternatively, the frame further comprises a plurality of clamping elements for clamping or comprises an upper clamping board and a lower clamping board for fixing the flexible multi-layer substrate in the frame.

The present invention further comprises a testing method of the above-mentioned testing device. The method comprises:

providing a flexible multi-layer substrate having at least one electrical testing point formed on an upper surface of the flexible multi-layer substrate;

moving the chip, such that the at least one electrical connecting point correspondingly contacts the at least one electrical testing point; and performing the electrical test to the chip.

Since the testing device and the testing method thereof of the present invention do not utilize the conventional probe technology to perform the electrical test to the electrical connecting point (soldering balls and bumps), the present invention has advantages that the electrical connecting points (soldering balls and bumps) on the chip or a wafer are not broken, and appearances, shapes and structures of the electrical connecting points and electrical testing points can maintain completeness. Furthermore, the present invention can be applied to high density and fine pitch wafer level tests with the development of fine pitch technology. Furthermore, the present invention further has an advantage that the requirement for the contact resistance in the electrical test can be met.

DETAILED DESCRIPTION OF THE INVENTION

Figure 1:
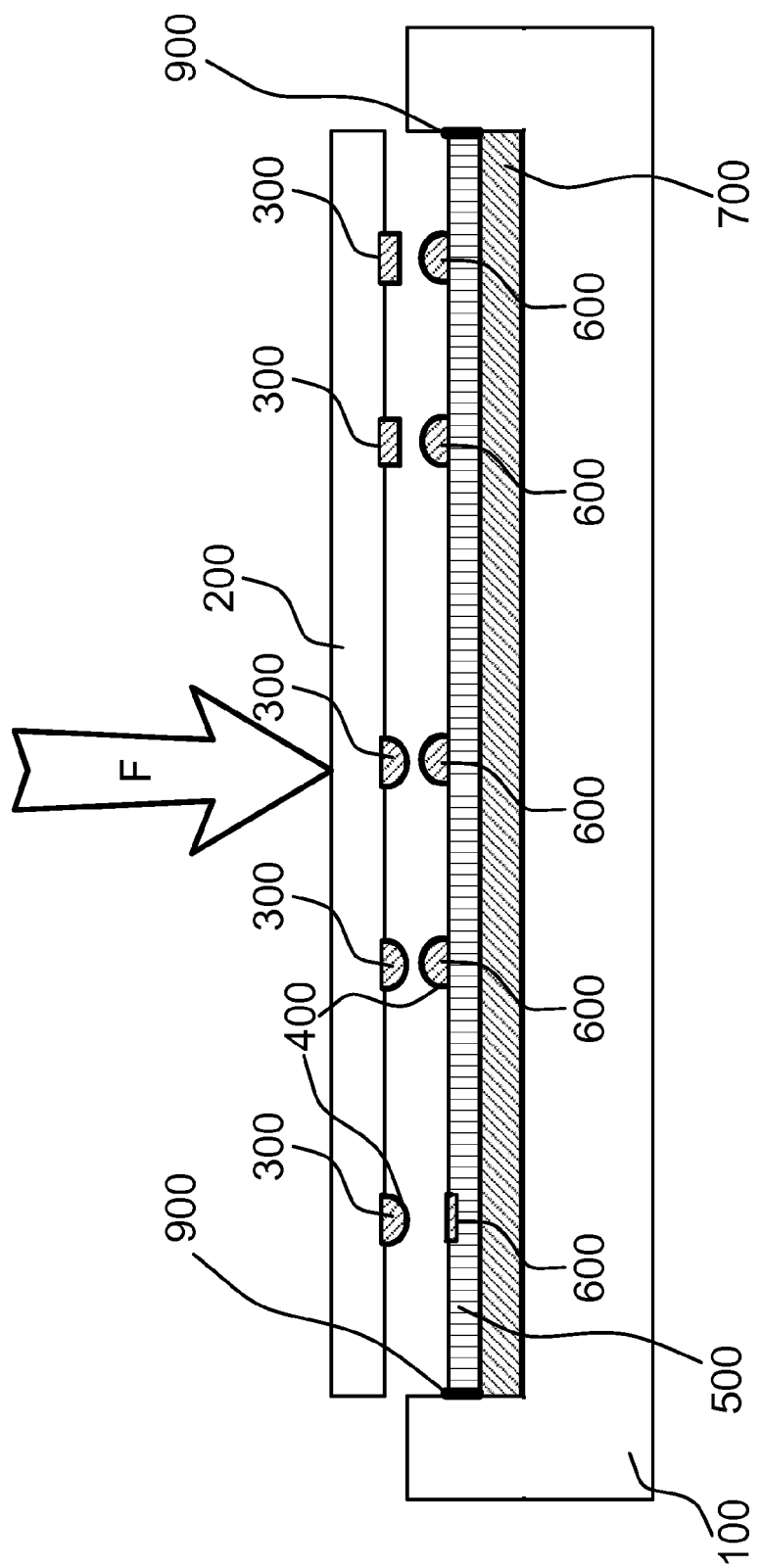
FIG. 1 depicts a sectional view of a testing device according to a first embodiment of the present invention.

Please refer to FIG. 1 of the present invention. FIG. 1 depicts a sectional view of a testing device according to a first embodiment of the present invention. In the present embodiment, the testing device of the present invention is utilized for performing an electrical test to a chip 200 or a wafer which is not cut and has a plurality of chips 200. The testing device comprises a frame 100, a flexible multi-layer substrate 500, at least one electrical testing point 600 formed on an upper surface of the flexible multi-layer substrate 500 and an elastic supporting body 700.

A method for manufacturing the flexible multi-layer substrate 500, for example, is to alternately form a plurality of metal layers and a plurality dielectric layers on a temporary substrate. The dielectric layers, for example, are formed of polyimide by a spin coating method. The metal layers are formed by a metal lift-off process. A thickness of one layer in the flexible multi-layer substrate 500 can be less than 20 µm or even 10 µm. Since the dielectric layers are formed of one material, stresses between layers of the flexible multi-layer substrate 500 are consistent. As a result, when the flexible multi-layer substrate 500 is separated from the temporary substrate, a warpage problem can be avoided.

Then, the electrical testing points 600 are formed on the upper surface of the flexible multi-layer substrate 500. As shown in FIG. 1, at least one electrical connecting point 300 is formed on a surface of the chip 200. For example, the electrical connecting point 300 is a micro bump (MB) utilized for a flip-chip process after a test. The chip 200 (die) is packaged by a micro bump bonding method. Accordingly, the electrical testing points 600 on the flexible multi-layer substrate 500 are formed corresponding to the electrical connecting points 300 on the surface of the chip 200. The electrical testing points 600 are utilized for contacting the electrical connecting points 300 for performing an electrical test to the chip 200. It is well known that the flexible multi-layer substrate 500 will be electrically connected to an external circuit and an electrical testing system (not shown in FIG. 1) for testing the chip.

Furthermore, as shown in FIG. 1, each of the electrical testing points 600 may be a bump or a metal pad. Each of the electrical connecting points 300 may be a bump or a metal pad as well. When each of the electrical connecting points 300 is a metal pad, each of the electrical testing points 600 is a bump. The electrical connecting points 300 contact the electrical testing points 600 for performing the electrical test. Alternatively, each of the electrical connecting points 300 is a bump, while each of the electrical testing points 600 is a metal pad. The electrical connecting points 300 contact the electrical testing points 600 for performing the electrical test. Alternatively, both of the electrical connecting points 300 and the electrical testing points 600 are bumps, and they contact each other for performing the electrical test.

And as mentioned above, the testing device of the present invention is utilized for performing the electrical test to the chip 200 or a wafer which is not cut and have a plurality of chips 200. An area formed in the frame 100 is larger than the chip 200 required to be electrically tested, such that the chip 200 can be positioned in the frame 100. A shape of the frame 100 of the present invention may be rectangular, circular and so on. It is not limited to a specific shape.

When the flexible multi-layer substrate 500 is fixed in the frame 100, the surface having the electrical testing points 600 faces upward. After the flexible multi-layer substrate 500 is electrically connected to the external circuit and the electrical testing system, the electrical test can be performed to the chip 200. The surface of the chip 200 having the electrical connecting points 300 faces downward. The chip 200 is moved, such that the electrical connecting points 300 contact the electrical testing points 600. As shown in FIG. 1, a specific force F is applied to the chip 200. It is noted that the applied specific force F can make a contact area between each electrical connecting point 300 and the corresponding electrical testing point 600 larger than 1 $\mu m^2$ and can make a contact resistance as each electrical connecting point 300 contacts the corresponding electrical testing point 600 less than 5 ohm. A preferred value of the contact resistance is less than 1 ohm. Furthermore, the present invention is mostly applied to high density and fine pitch wafer level package. Accordingly, a height of each electrical connecting point 300 or each electrical testing point 600 is less than 100 µm.

Furthermore, each electrical connecting point 300 utilized in the industry is a small-sized bump. According to the present invention, a metal 400, i.e. an inert metal or a precious metal, is further formed on a surface of each electrical connecting point 300 for providing a low reactive surface to prevent oxidation. For example, gold (Au) or platinum (Pt) is utilized for covering the surface of each electrical connecting point 300. An inert metal or a precious metal may be formed on the surface of each electrical testing point 600. Accordingly, a low reactive surface which is capable of efficiently isolating the connecting point 300 from the outer atmosphere can be formed to prevent oxidation. For example, gold (Au) or platinum (Pt) is utilized for covering the surface of each electrical testing point 600. Alternatively, each electrical testing point 600 is manufactured by an inert metal or a precious metal.

An object of forming the inert metal or the precious metal is to ensure that there is no oxidation layer between each electrical connecting point 300 and the corresponding electrical testing point 600. Accordingly, the step of mechanically destroying the oxidation layer in the prior arts for acquiring the electrical contact is not required when each electrical connecting point 300 contacts the electrical testing point 600. Any conductive material which is not oxidized easily may be served as the metal 400 (inert metal or precious metal). The concept that the oxidation layer is not required to be mechanically destroyed can implement a structural completeness between the surface of each electrical connecting point 300 and the surface of the corresponding electrical testing point 600.

As a result, according to the testing device where gold contacts gold, the problem of destroying the soldering balls and the bumps in the conventional probe method does not occur. Consequently, the present invention can be applied to high density and fine pitch wafer level tests with the development of fine pitch technology. Furthermore, a large external force is not required. In the conventional probe technology, the oxidation layer of each electrical connecting point 300 (soldering balls or bumps) is required to be broken for ensuring validity of the test. According to the present invention, not only appearances, shapes and structural completenesses of each electrical connecting point 300 and each electrical testing point 600 can maintain, but also the structural completeness of the contact area can maintain. Accordingly, probe marks are not easily produced. The shape of each electrical connecting point 300 and the shape of each electrical testing point 600 can maintain completeness after the electrical tests. That is, the present invention can achieve the advantages that the contact area between each electrical connecting point 300 and the corresponding electrical testing point 600 is larger than 1 $\mu m^2$, the contact resistance is less than 5 ohm, and a preferred value of the contact resistance is less than 1 ohm. Compared with the conventional test probes, the flexible multi-layer substrate 500 of the present invention utilized in the electrical tests can be reused for more times because each electrical testing point 600 does not destroy the corresponding electrical connecting point 300. Accordingly, usage life can be extended greatly.

In practical applications, a thickness of the metal 400 may be ranged from 10 nm to 100 nm for ensuring good electrical contact between each electrical connecting point 300 and the corresponding electrical testing point 600. The thickness may be larger. In the applications of soldering bumps, by performing a thermal process, like a reflow process, the metal 400 can be dissolved in the electrical connecting point 300 or the electrical testing point 600 which is formed of tin. Since a portion of ingredients is quite low, the following soldering and bonding processes are not affected.

Furthermore, as shown in FIG. 1, the elastic supporting body 700 of the testing device of the present invention is disposed between the frame 100 and the flexible multi-layer substrate 500. When each electrical connecting point 300 contacts the corresponding electrical testing point 600 and the specific force F is generated, the elastic supporting body 700 provides a supporting force to the flexible multi-layer substrate 500. A material and a shape of the elastic supporting body 700 are not limited, as long as the elastic supporting body 700 can have supporting effect.

Figure 2:
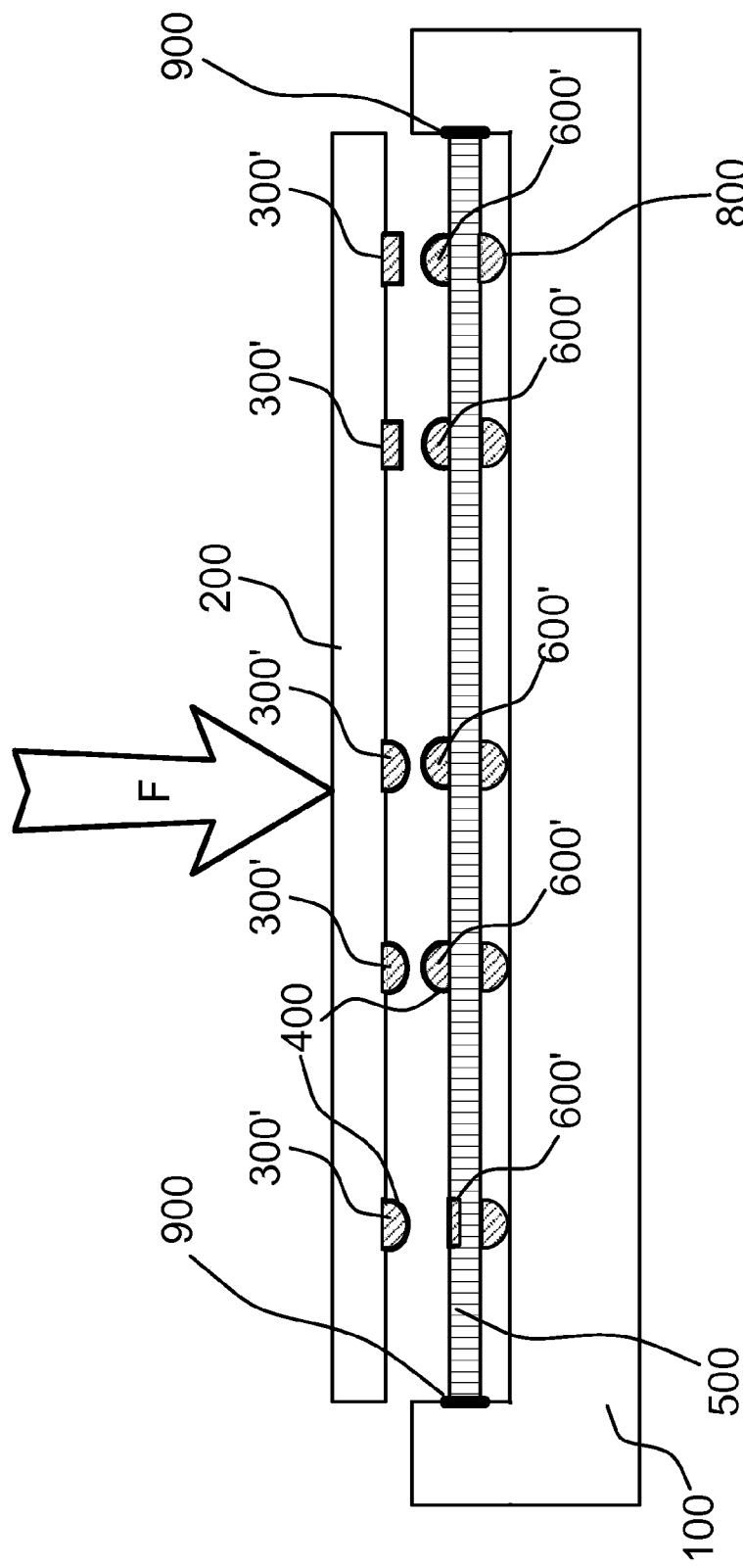
FIG. 2 depicts a sectional view of a testing device according to a second embodiment of the present invention.

Please refer to FIG. 2 of the present invention. FIG. 2 depicts a sectional view of a testing device according to a second embodiment of the present invention. In the second embodiment of the present invention, the testing device comprises a frame 100, a flexible multi-layer substrate 500, at least one electrical testing point 600' formed on an upper surface of the flexible multi-layer substrate 500 and at least one supporting protruding point 800.

The same as the first embodiment, a plurality of metal layers and a plurality dielectric layers are alternately formed on a temporary substrate. The dielectric layers, for example, are formed of polyimide by a spin coating method. The metal layers are formed by a metal lift-off process. A thickness of one layer in the flexible multi-layer substrate 500 can be less than 20 µm or even 10 µm. Since the dielectric layers are formed of one material, stresses between layers of the flexible multi-layer substrate 500 are consistent. As a result, when the flexible multi-layer substrate 500 is separated from the temporary substrate, a warpage problem can be avoided. Then, the electrical testing points 600' are formed on the upper surface of the flexible multi-layer substrate 500. As shown in FIG. 2, at least one electrical connecting point 300' is formed on a surface of the chip 200. For example, the electrical connecting point 300' is a micro bump (MB) utilized for a flip-chip process after a test. The chip 200 (die) is packaged by a micro bump bonding method. Accordingly, the electrical testing points 600' on the flexible multi-layer substrate 500 are formed corresponding to the electrical connecting points 300' on the surface of the chip 200.

As mentioned above, the testing device of the present invention is utilized for performing the electrical test to the chip 200 or a wafer which is not cut and have a plurality of chips 200. An area formed in the frame 100 is larger than the chip 200 required to be electrically tested, such that the chip 200 can be positioned in the frame 100. A shape of the frame 100 of the present invention may be rectangular, circular and so on. It is not limited to a specific shape.

According to the present invention, a metal 400, i.e. an inert metal or a precious metal, is further formed on a surface of each electrical connecting point 300' for providing a low reactive surface to prevent oxidation. For example, gold (Au) or platinum (Pt) is utilized for covering the surface of each electrical connecting point 300'. An inert metal or a precious metal may be formed on the surface of each electrical testing point 600'. Accordingly, a low reactive surface which is capable of efficiently isolating the electrical testing point 600' from the outer atmosphere can be formed to prevent oxidation. For example, gold (Au) or platinum (Pt) is utilized for covering the surface of each electrical testing point 600'. Alternatively, each electrical testing point 600' is manufactured by an inert metal or a precious metal.

An object of forming the inert metal or the precious metal is to ensure that there is no oxidation layer between each electrical connecting point 300' and the corresponding electrical testing point 600'. Accordingly, the step of mechanically destroying the oxidation layer in the prior arts for acquiring the electrical contact is not required when each electrical connecting point 300' contacts the electrical testing point 600'. Any conductive material which is not oxidized easily may be served as the metal 400 (inert metal or precious metal). The concept that the oxidation layer is not required to be mechanically destroyed can implement a structural completeness between the surface of each electrical connecting point 300' and the surface of the corresponding electrical testing point 600'. Furthermore, the present invention is mostly applied to high density and fine pitch wafer level package. Accordingly, a height of each electrical connecting point 300' and each electrical testing point 600' is less than 100 μm. As shown in FIG. 2, the second embodiment of the present invention comprises the supporting protruding points 800. Positions of the supporting protruding points 800 are formed on a lower surface of the flexible multi-layer substrate 500 (a surface opposite to the surface on which the electrical testing points 600' are formed), and the supporting protruding points 800 are formed corresponding to the electrical testing points 600'. When each electrical connecting point 300' contacts the corresponding electrical testing point 600' and the specific force F is generated, the supporting protruding points 800 provide a supporting force to the flexible multi-layer substrate 500. A material and a shape of each supporting protruding point 800 are not limited, as long as the supporting protruding points 800 can have supporting effect.

A testing method is the same as that in the first embodiment. When the flexible multi-layer substrate 500 is fixed in the frame 100, the surface having the electrical testing points 600' faces upward. After the flexible multi-layer substrate 500 is electrically connected to an external circuit and an electrical testing system, the electrical test can be performed to the chip 200. The surface of the chip 200 having the electrical connecting points 300' faces downward. The chip 200 is moved, such that the electrical connecting points 300' contact the electrical testing points 600' and applies the specific force F to the chip 200 as shown in FIG. 2. It is noted that the applied specific force F can make a contact area between each electrical connecting point 300' and the corresponding electrical testing point 600' larger than 1 μm$^2$ and can make a contact resistance as each electrical connecting point 300' contacts the corresponding electrical testing point 600' less than 5 ohm. A preferred value of the contact resistance is less than 1 ohm. As a result, according to the testing device where gold contacts gold, the problem of destroying the soldering balls and the bumps in the conventional probe method does not occur. Consequently, the present invention can be applied to high density and fine pitch wafer level tests with the development of fine pitch technology. Furthermore, a large external force is not required. In the conventional probe technology, the oxidation layer of each electrical connecting point 300' (soldering balls or bumps) is required to be broken for ensuring validity of the test. According to the present invention, not only appearances, shapes and structural completenesses of each electrical connecting point 300' and each electrical testing point 600' can maintain, but also the structural completeness of the contact area can maintain. Accordingly, probe marks are not easily produced. The shape of each electrical connecting point 300' and the shape of each electrical testing point 600' can maintain completeness after the electrical tests. That is, the present invention can achieve the advantages that the contact area between each electrical connecting point 300' and the corresponding electrical testing point 600' is larger than 1 μm$^2$, the contact resistance is less than 5 ohm, and a preferred value of the contact resistance is less than 1 ohm. Compared with the conventional test probes, the flexible multi-layer substrate 500 of the present invention utilized in the electrical tests can be reused for more times because each electrical testing point 600' does not destroy the corresponding electrical connecting point 300'. Accordingly, usage life can be extended greatly.

Furthermore, as mentioned above, each of the electrical connecting points 300' and the electrical testing points 600' may be a bump or a metal pad. If each of the electrical connecting points 300' and the electrical testing points 600' is a bump, the bump may be a semi-spherical shape as shown in FIG. 2 or a flat metal pad. The shape may be cylindrical, bulk-shaped, protruding, a pyramidal with a ball-shaped apex and so on. The shape is not limited as long as the above-mentioned conditions, that is, the probe marks are not produced easily, the contact area is larger than 1 μm$^2$, the contact resistance is less than 5 ohm, and the preferred value of the contact resistance is less than 1 ohm, are met.

Figure 3:
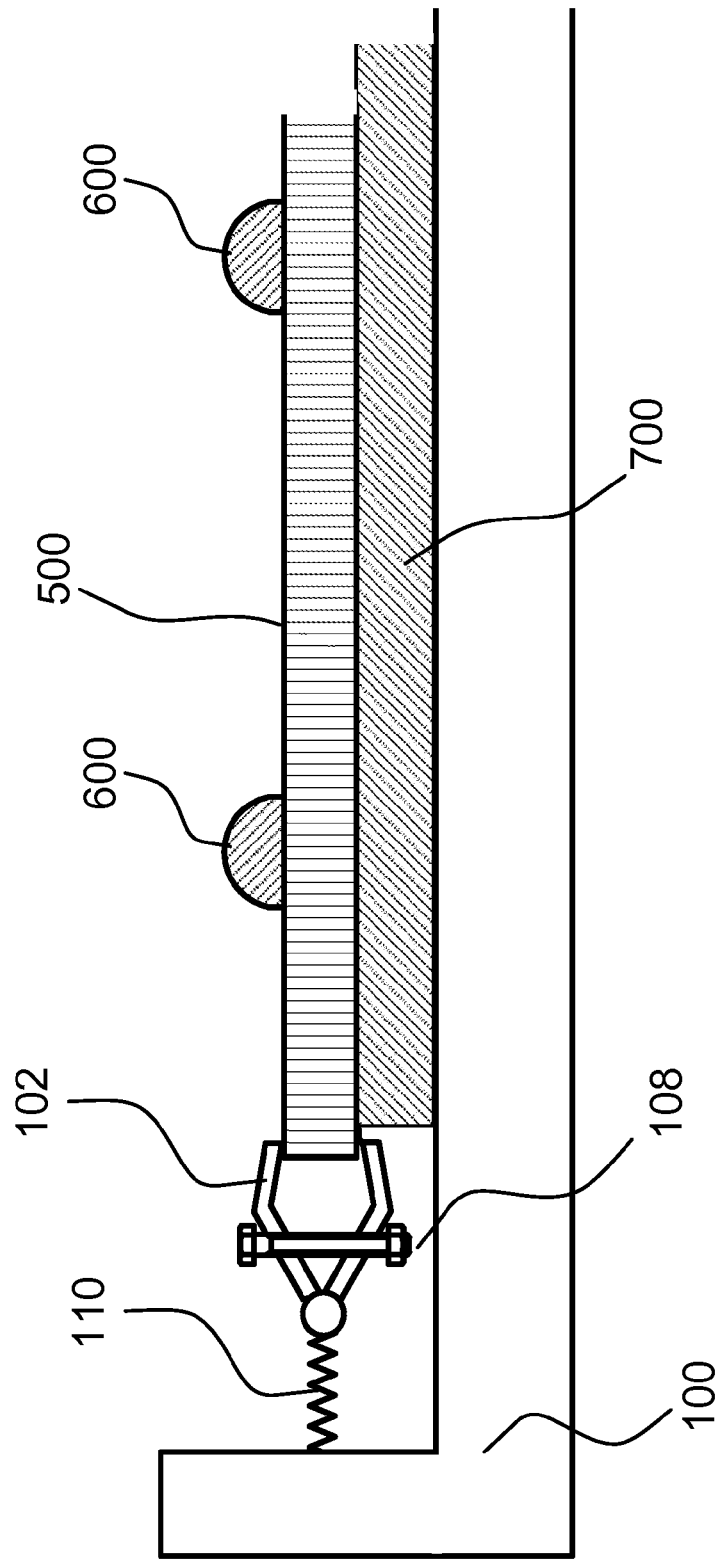
FIG. 3 depicts a diagram showing that the flexible multi-layer substrate is fixed in the testing device of the present invention by a clamping method.
Figure 4:
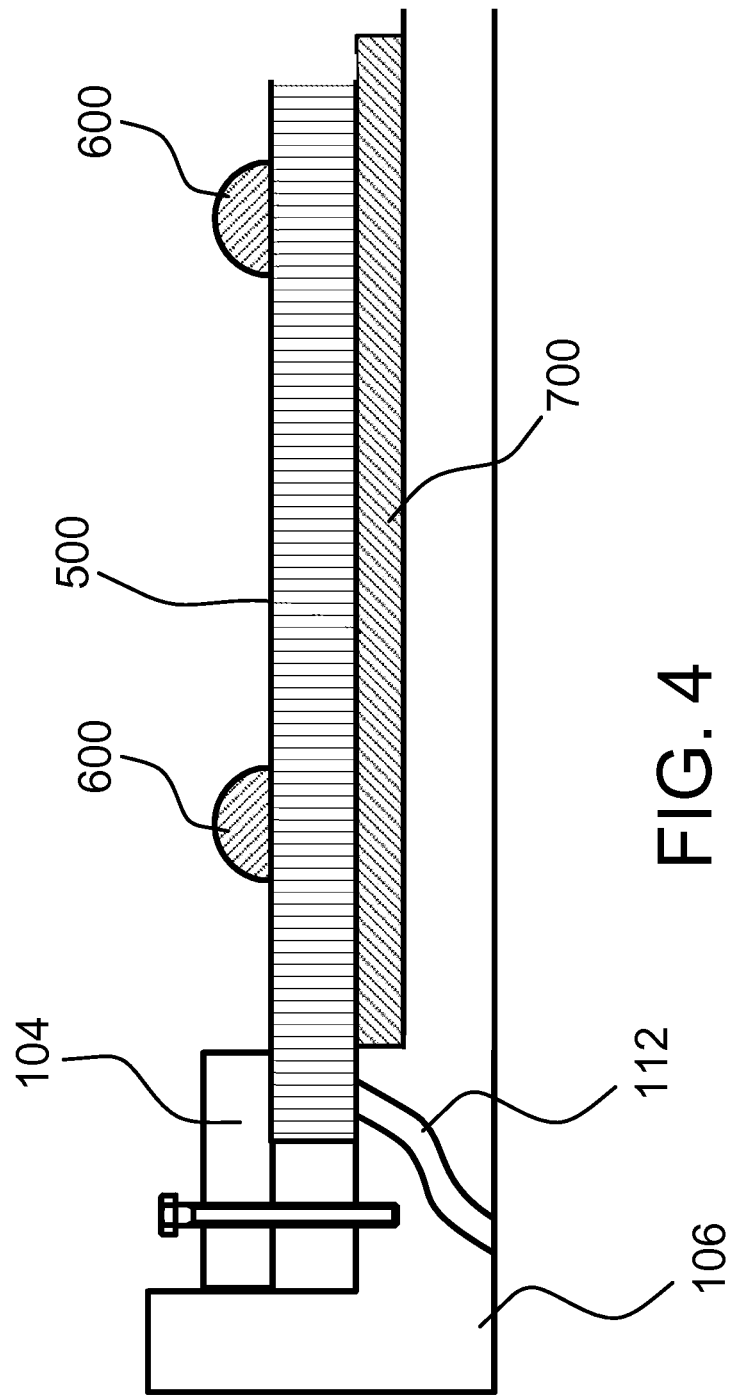
FIG. 4 depicts a diagram showing that the flexible multi-layer substrate is fixed in the testing device of the present invention with clamping boards.

Please refer to FIG. 3 and FIG. 4. FIG. 3 depicts a diagram showing that the flexible multi-layer substrate is fixed in the testing device of the present invention by a clamping method. FIG. 4 depicts a diagram showing that the flexible multi-layer substrate is fixed in the testing device of the present invention with clamping boards. As mentioned in the first and second embodiments shown in FIG. 1 and FIG. 2, the flexible multi-layer substrate 500 is fixed in the frame 100 with fixing contacts 900. As shown in FIG. 1 and FIG. 2, the flexible multi-layer substrate 500 may be fixed in the frame 100 by soldering edges of the flexible multi-layer substrate 500. Alternatively, the frame 100 of the present invention may further comprise a plurality of clamping elements 102 as shown in FIG. 3. Each clamping element 102 comprises a clamping screw 108 and an adjustable spring 110 for clamping the flexible multi-layer substrate 500 in the frame 100, and it can adjust tension of the flexible multi-layer substrate 500. Alternatively, as shown in FIG. 4, the frame 100 of the present invention may further comprise an upper clamping board 104 and a lower clamping board 106 for fixing the flexible multi-layer substrate 500 in the frame 100. The lower clamping board 106 comprises an absorbing hole 112 for stably clamping the flexible multi-layer substrate 500 by a suction method.

Figure 5:
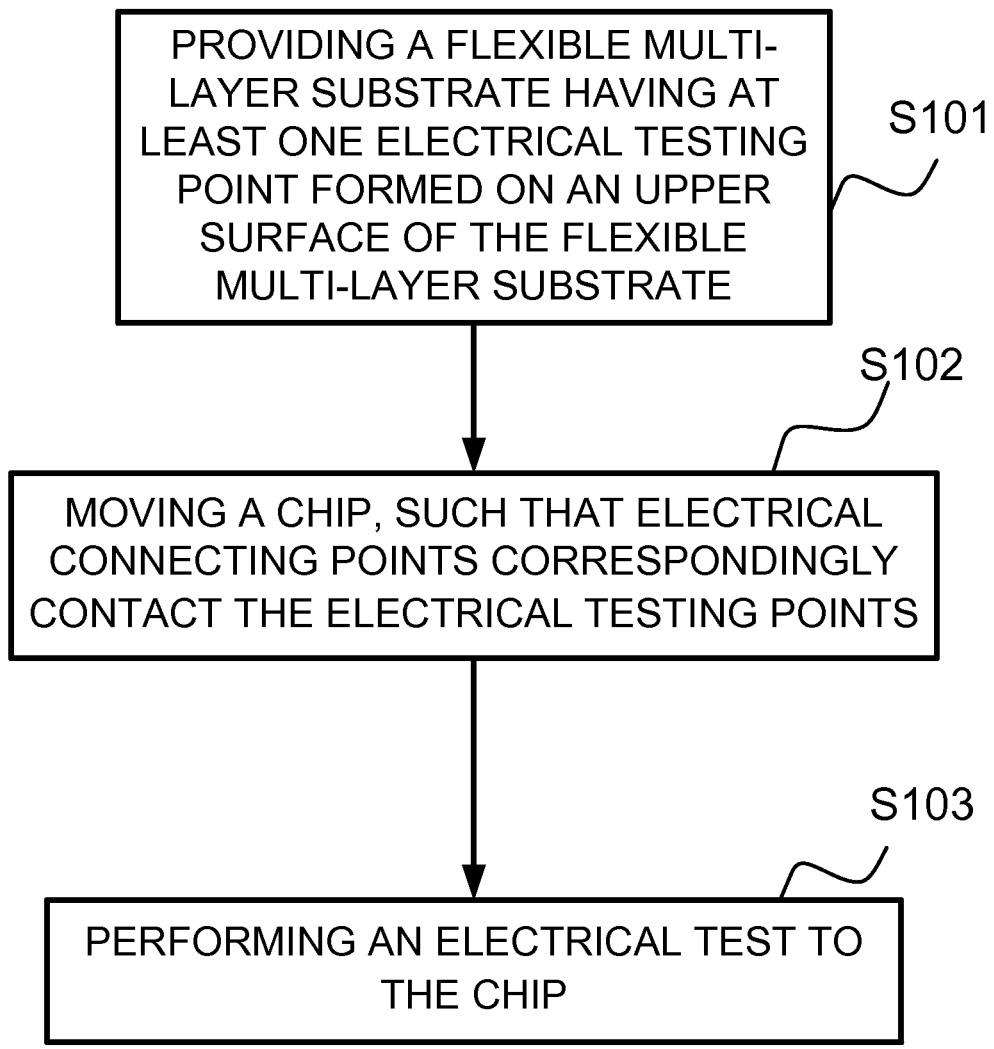
FIG. 5 depicts a flowchart of a testing method of a testing device according to the present invention.

Please refer to FIG. 1 to FIG. 5. FIG. 5 depicts a flowchart of a testing method of a testing device according to the present invention. The testing method of the testing device according to the present invention comprises the following steps:

in step S101, providing a flexible multi-layer substrate 500 having at least one electrical testing point 600 formed on an upper surface of the flexible multi-layer substrate 500;

in step S102, moving a chip 200, such that electrical connecting points 300 contact the electrical testing points 600; and in step S103, performing an electrical test to the chip 200.

When the electrical test is performed to the chip 200, a specific force F is applied to the chip 200. The shape of flexible multi-layer substrate 500 is flexible. Accordingly, height differences of the plural electrical connecting points 300 resulted from warpage of the substrate utilized for supporting the chip 200 can be compensated when the flexible multi-layer substrate 500 of the present invention is utilized for electrically testing the chip 200. That is, if the height differences of the electrical connecting points 300 of the chip 200 or another device to be tested are large, a tolerance degree by utilizing the flexible multi-layer substrate 500 of the present invention for the electrical test is larger than that in the prior arts. Accordingly, other compensating methods are not required.

Moreover, as mentioned above, the contact area between each electrical connecting point 300 and the corresponding electrical testing point 600 is larger than 1 μm$^2$, the contact resistance as each electrical connecting point 300 contacts the corresponding electrical testing point 600 is less than 5 ohm, and a preferred value of the contact resistance is smaller than 1 ohm according to the present invention. After the electrical test, not only appearances, the structures of each electrical connecting point 300 and each electrical testing point 600 can maintain completeness, and the structural completeness of the contact area can maintain.

Furthermore, the method further comprises a step of forming an inert metal or a precious metal 400 on a surface of each electrical connecting point 300 or each electrical testing point 600 for providing a low reactive surface to prevent oxidation before the step of providing the flexible multi-layer substrate 500.

Furthermore, the method further comprises a step of performing a thermal process, like a reflow process, to the chip 200 after the step of performing the electrical test to the chip 200, to dissolve the inert metal or the precious metal 400 in the electrical connecting point 300.

Furthermore, the method further comprises a step of disposing an elastic supporting body 700 between the frame 100 and flexible multi-layer substrate 500, to provide a supporting force to the flexible multi-layer substrate 500 in the step of performing the electrical test to the chip 200 before the step of providing the flexible multi-layer substrate 500.

Alternatively, the method further comprises a step of forming at least one supporting protruding point 800 on a lower surface of the flexible multi-layer substrate 500, to provide a supporting force to the flexible multi-layer substrate 500 in the step of performing the electrical test to the chip 200 before the step of providing the flexible multi-layer substrate 500.

Furthermore, the method further comprises a step of fixing the flexible multi-layer substrate 500 in the frame 100 in the step of providing the flexible multi-layer substrate 500. The flexible multi-layer substrate 500 is fixed in the frame 100 by soldering edges of the flexible multi-layer substrate 500. For example, the edges of the flexible multi-layer substrate 500 are soldered for forming the fixing contacts 900.

The frame 100 may further comprise a plurality of clamping elements 102 or comprise an upper clamping board 104 and a lower clamping board 106, so as to clamp the flexible multi-layer substrate 500 and fix the flexible multi-layer substrate 500 in the frame 100 in the step of fixing the flexible multi-layer substrate 500.

In summary, since the testing device and the testing method of the testing device are different from the conventional probe technology and adopts the electrical test where gold contacts gold, the soldering balls or bumps on the chip or the wafer are not destroyed. Furthermore, the present invention has a better contact resistance. Finally, the present invention is suitable for the electrical tests with high density and fine pitch wafer level package.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A testing device, comprising:
   a frame, positioned corresponding to a chip, and at least one electrical connecting point formed on a surface of the chip;
   a flexible multi-layer substrate fixed in the frame, wherein the flexible multi-layer substrate is fixed in the frame by soldering edges of the flexible multi-layer substrate; and
   at least one electrical testing point corresponding to the at least one electrical connecting point, formed on an upper surface of the flexible multi-layer substrate for contacting the at least one electrical connecting point for performing an electrical test to the chip.

2. The testing device according to claim 1, wherein structures of the at least one electrical connecting point and the least one electrical testing point maintain completeness after the electrical test is performed.

3. The testing device according to claim 1, wherein a contact area between the at least one electrical connecting point and the at least one electrical testing point is larger than 1 $\mu m^2$ when the electrical test is performed to the chip.

4. The testing device according to claim 3, wherein a surface structure of the contact area maintains completeness.

5. The testing device according to claim 1, wherein a height of the at least one electrical connecting point or the at least one electrical testing point is less than 100 $\mu m$.

6. The testing device according to claim 1, wherein a contact resistance as the at least one electrical connecting point contacts the at least one electrical testing point is less than 5 ohm.

7. The testing device according to claim 1, wherein a contact resistance as the at least one electrical connecting point contacts the at least one electrical testing point is less than 1 ohm.

8. The testing device according to claim 1, wherein an inert metal or a precious metal is formed on or covers a surface of the at least one electrical connecting point.

9. The testing device according to claim 8, wherein the at least one electrical connecting point is a bump.

10. The testing device according to claim 1, wherein an inert metal or a precious metal is formed on or covers a surface of the at least one electrical testing point.

11. The testing device according to claim 10, wherein the at least one electrical testing point is a bump.

12. The testing device according to claim 1, further comprising an elastic supporting body disposed between the frame and the flexible multi-layer substrate, and the elastic supporting body is utilized for providing a supporting force to the flexible multi-layer substrate when the at least one electrical connecting point contacts the at least one electrical testing point and applies a force to the at least one electrical testing point.

13. The testing device according to claim 1, further comprising at least one supporting protruding point formed on a lower surface of the flexible multi-layer substrate and corresponding to the at least one electrical testing point, and the at least one supporting protruding point is utilized for providing a supporting force to the flexible multi-layer substrate when the at least one electrical connecting point contacts the at least one electrical testing point and applies a force to the at least one electrical testing point.

14. A testing method for performing an electrical test to a chip having at least one electrical connecting point, comprising steps of:
   forming an inert metal or a precious metal on a surface of the at least one electrical connecting point;
   providing a flexible multi-layer substrate having at least one electrical testing point formed on an upper surface of the flexible multi-layer substrate;
   moving the chip, such that the at least one electrical connecting point correspondingly contacts the at least one electrical testing point;
   performing the electrical test to the chip; and
   performing a thermal process to the chip to dissolve the inert metal or the precious metal in the electrical connecting point.

15. The testing method according to claim 14, wherein structures of the at least one electrical connecting point and the least one electrical testing point maintain completeness after performing the electrical test.

16. The testing method according to claim 14, wherein a contact area as the at least one electrical connecting point contacts the at least one electrical testing point is larger than 1 μm² in the step of performing the electrical test.

17. The testing method according to claim 16, wherein a surface structure of the contact area maintains completeness.

18. The testing method according to claim 14, wherein a height of the at least one electrical connecting point or the at least one electrical testing point is less than 100 μm.

19. The testing method according to claim 14, wherein a contact resistance as the at least one electrical connecting point contacts the at least one electrical testing point is less than 5 ohm.

20. The testing method according to claim 14, wherein a contact resistance as the at least one electrical connecting point contacts the at least one electrical testing point is less than 1 ohm.

21. The testing method according to claim 14, wherein the at least one electrical connecting point is a bump.

22. The testing method according to claim 14, further comprising a step of forming an inert metal or a precious metal on a surface of the at least one electrical testing point before the step of providing the flexible multi-layer substrate.

23. The testing device according to claim 22, wherein the at least one electrical testing point is a bump.

24. The testing method according to claim 14, further comprising a step of disposing an elastic supporting body between a frame supporting the flexible multi-layer substrate and the flexible multi-layer substrate, to provide a supporting force to the flexible multi-layer substrate in the step of performing the electrical test to the chip before the step of providing the flexible multi-layer substrate.

25. The testing method according to claim 14, further comprising a step of forming at least one supporting protruding point on a lower surface of the flexible multi-layer substrate, to provide a supporting force to the flexible multi-layer substrate in the step of performing the electrical test to the chip before the step of providing the flexible multi-layer substrate.

26. The testing method according to claim 14, further comprising a step of fixing the flexible multi-layer substrate in a frame in the step of providing the flexible multi-layer substrate, wherein the flexible multi-layer substrate is fixed in the frame by soldering edges of the flexible multi-layer substrate.

27. The testing method according to claim 14, further comprising a step of clamping the flexible multi-layer substrate in a frame with a plurality of clamping elements in the step of fixing the flexible multi-layer substrate.

28. The testing method according to claim 27, wherein the clamping elements comprise an upper clamping board and a lower clamping board for fixing the flexible multi-layer substrate in the frame.

* * * * *